United States Patent
Andreev et al.

(10) Patent No.: US 7,283,385 B2
(45) Date of Patent: Oct. 16, 2007

(54) RRAM COMMUNICATION SYSTEM

(75) Inventors: Alexander E. Andreev, San Jose, CA (US); Sergey Gribok, Santa Clara, CA (US); Anatoli A. Bolotov, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 227 days.

(21) Appl. No.: 10/999,481

(22) Filed: Nov. 30, 2004

(65) Prior Publication Data

US 2006/0136775 A1 Jun. 22, 2006

(51) Int. Cl.
*G11C 29/00* (2006.01)
(52) U.S. Cl. .................... 365/158; 365/201; 714/5
(58) Field of Classification Search ........... 365/189.04
See application file for complete search history.

(56) References Cited

U.S. PATENT DOCUMENTS

| 5,953,689 A * | 9/1999 | Hale et al. ................. 702/186 |
| 6,427,224 B1 * | 7/2002 | Devins et al. ................. 716/4 |
| 6,829,730 B2 * | 12/2004 | Nadeau-Dostie et al. ..... 714/30 |
| 6,934,898 B1 * | 8/2005 | Goff .......................... 714/727 |

* cited by examiner

*Primary Examiner*—Tan T. Nguyen
(74) *Attorney, Agent, or Firm*—Suiter Swantz PC LLO

(57) ABSTRACT

The present invention provides a RRAM communication system including at least one RRAM controller and a master controller. The master controller is communicatively coupled to each of at least one RRAM controller. The master controller is suitable for loading test input parameters into at least one RRAM controller, starting execution of a test and obtaining a result of test execution from at least one RRAM controller. Each of at least one RRAM controller is suitable for executing different tests depending on commands received from the master controller.

26 Claims, 6 Drawing Sheets

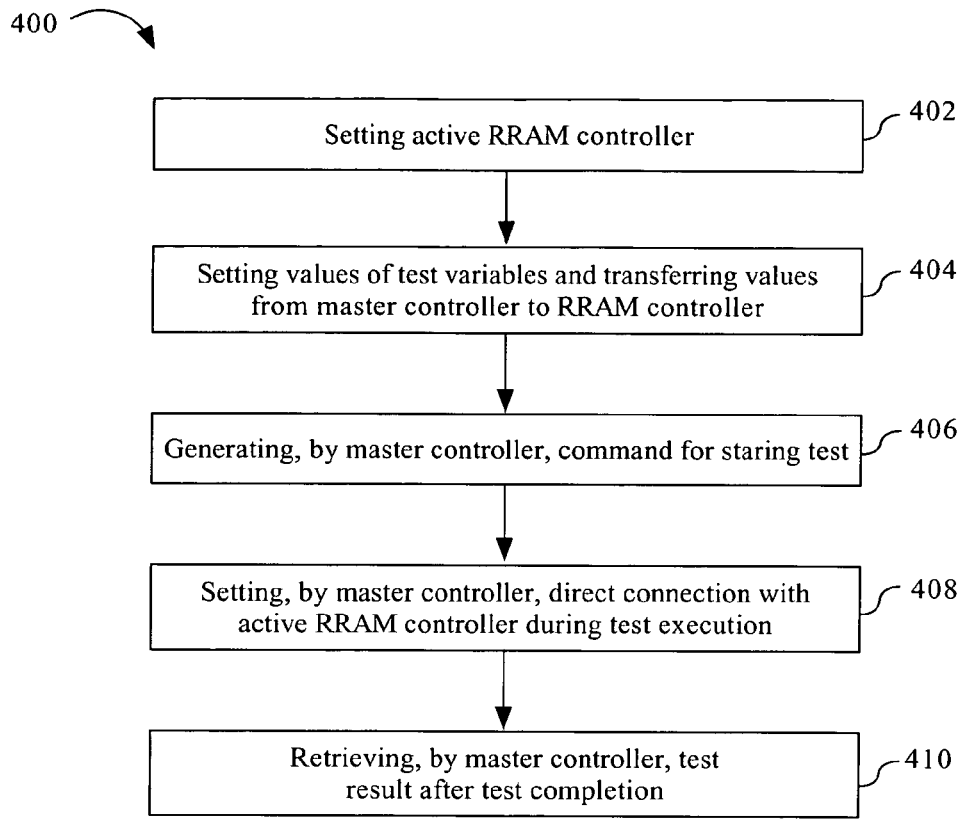

*FIG. 4*

| RRAM Command Name | RRAM Command Description |
|---|---|
| SET_ACTIVE_RRAM | Set active RRAM Controller |
| SET_INP4_<i> | Transfer value of INP4<i> to RRAM Controller |
| SET_INP8_<i> | Transfer value of INP8<i> to RRAM Controller |
| CORE_RRAM_COM_<i> | These commands are performed by CORE RRAM submodule |
| GET_RESULT_<i> | Retrieve test results from RRAM Controller |
| END_GO | Retrieve test results from RRAM Controller |

*FIG. 5*

RRAM COMMUNICATION SYSTEM

FIELD OF THE INVENTION

The present invention generally relates to the field of integrated circuits, particularly to a RRAM communication system.

BACKGROUND OF THE INVENTION

Platform-based IC (integrated circuit) design is a powerful concept for coping with the increased pressure on time-to-market, design and manufacturing costs encountered in the current IC market. A platform is a large-scale, high-complexity semiconductor device that includes one or more of the following elements: (1) memory; (2) a customizable array of transistors; (3) an IP (intellectual property) block; (4) a processor, e.g., an ESP (embedded standard product); (5) an embedded programmable logic block; and (6) interconnect. RapidChip™ developed by LSI Logic Corp. is an instance of a platform. The basic idea behind the platform-based design is to avoid designing and manufacturing a chip from scratch. Some portion of the chip's architecture is predefined for a specific type of application. Through extensive design reuse, the platform-based design may provide faster time-to-market and reduced design cost.

Under a platform approach, there are two distinct steps entailed in creating a final end-user product: a prefabrication step and a customization step. In a prefabrication step, a slice is built on a wafer. A slice is a pre-manufactured chip in which all silicon layers have been built, leaving the metal layers or top metal layers to be completed with the customer's unique IP. For example, RapidSlice™ developed by LSI Logic Corp. is an instance of a slice. One or more slices may be built on a single wafer. It is understood that a slice may include one or more bottom metal layers or may include no metal layers at all. In a preferred embodiment of the prefabrication step, portions of the metal layers are pre-specified to implement the pre-defined blocks of the platform and the diffusion processes are carried out in a wafer fab. The base characteristics, in terms of the IP, the processors, the memory, the interconnect, the programmable logic and the customizable transistor array, are all pre-placed in the design and pre-diffused in the slice. However, a slice is still fully decoupled because the customer has not yet introduced the function into the slice. In a customization step, the customer-designed function is merged with the pre-defined blocks and the metal layers (or late-metal components) are laid down, which couple the elements that make up the slice built in the wafer fab, and the customizable transistor array is configured and given its characteristic function. In other embodiments, early-metal steps may be part of the pre-fabricated slice to reduce the time and cost of the customization step, resulting in a platform which is more coupled and specific. It is understood that a prefabrication step and a customization step may be performed in different foundries. For example, a slice may be manufactured in one foundry. Later, in a customization step, the slice may be pulled from inventory and metalized, which gives the slice its final product characteristics in a different foundry.

A slice such as RapidSlice™ may contain several RRAMs (Reconfigurable RAMs, or Redundant RAMs, or RapidSlice™ RAMs). Each RRAM is a set of memories of the same type that are placed compactly. RRAMs include built-in testing and self-repairing components and include a set of tools for mapping arbitrary customer memories (logical memories) to the memories from the matrix (physical memories). All RRAM memory ports are ports of customer memories. Ports of memories from the matrix are invisible from outside a RRAM. Thus, from the customer's point of view a RRAM is a set of customer memories.

The conventional strategy for testing memory matrices is to test every memory of every matrix separately. Thus, the conventional strategy for RRAM testing requires that many additional ports are added to a RRAM and these additional ports are connected with a TAP (Test Access Port) controller. Specifically, all ports of physical memories need be added. Moreover, different non-trivial test-vectors need be prepared for testing every memory.

Thus, it is desirable to provide a RRAM communication system, which may reduce the amount of routing between memory matrices (e.g., RapidChip™ memory matrices, or the like) and a TAP controller.

SUMMARY OF THE INVENTION

In an exemplary aspect, the present invention provides a method for implementing test execution in a RRAM communication system including a master controller and at least one RRAM controller. The master controller includes a master core submodule, a collector submodule, and a coder submodule. Each of the at least one RRAM controller includes a RRAM core submodule, a controller submodule, and a decoder submodule. The present method may include steps as follows. One of at least one RRAM controller is set active. Values of test variables are set by the master controller, and the values of test variables are transferred from the master controller to the active RRAM controller. A command for starting test is generated by the master controller. A direct connection with the active RRAM controller is set by the master controller during test execution. A test result is retrieved by the master controller after test completion using a command GET_RESULT_<i>.

In an additional exemplary aspect, the present invention provides a RRAM communication system including at least one RRAM controller and a master controller. The master controller is communicatively coupled to each of at least one RRAM controller. The master controller is suitable for loading test input parameters into at least one RRAM controller, starting execution of a test and obtaining a result of test execution from at least one RRAM controller. Each of at least one RRAM controller is suitable for executing different tests depending on commands received from the master controller.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 4 is a flow diagram of a method for implementing test execution using the RRAM communication system shown in FIG. 1 in accordance with an exemplary embodiment of the present invention;

FIG. 5 is a description of master controller commands in accordance with an exemplary embodiment of the present invention;

DETAILED DESCRIPTION OF THE INVENTION

Reference will now be made in detail to the presently preferred embodiments of the invention, examples of which are illustrated in the accompanying drawings.

The conventional strategy for testing memory matrices is to test every memory of every matrix separately. Thus, the conventional strategy for RRAM testing requires that many additional ports are added to a RRAM and these additional ports are connected with a TAP (Test Access Port) controller. Specifically, all ports of physical memories need be added. Moreover, different non-trivial test-vectors need be prepared for testing every memory. In order to solve these problems, the present invention adds additional controllers (a master controller and one or more RRAM controllers) into a RRAM system. These controllers perform test and repair operations. All these controllers may communicate with each other via a RRAM communication system.

The present invention provides a communication scheme and algorithms of communication of a master controller and one or more RRAM controllers inside a RRAM communication system such as the RapidChip™ memory subsystem or the like. The present RRAM communication system may reduce the amount of routing between memory matrices (e.g., RapidChip™ memory matrices, or the like) and a TAP controller by several times. The present communication scheme not only applies to a RRAM module, but also applies to any system including one master controller and one or more slave controllers without departing from the scope and spirit of the present invention.

A. RRAM Communication System Overview

Figure 1:
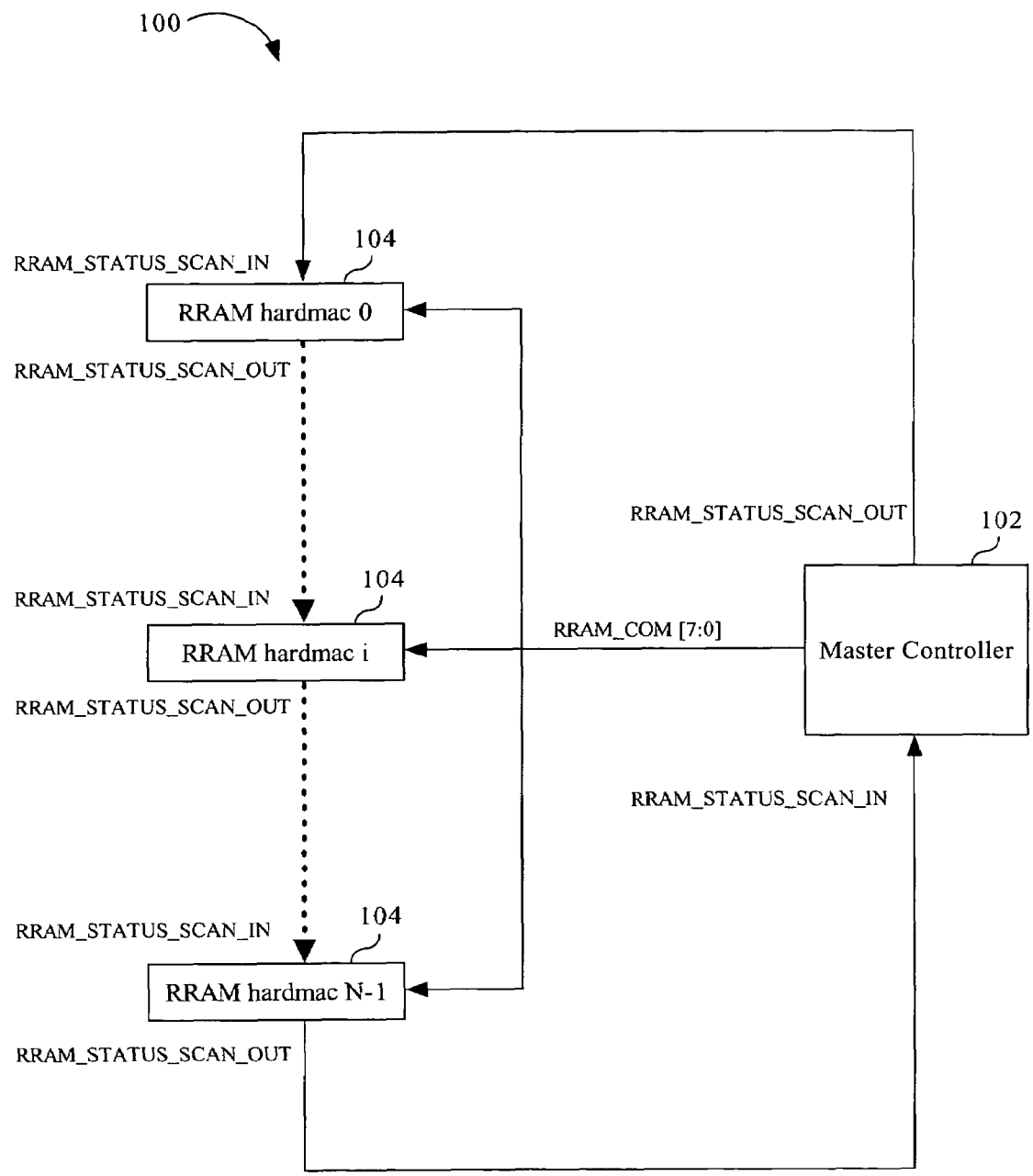
FIG. 1 is a schematic diagram of a RRAM communication system including a master controller and N RRAM controllers (N>0) in accordance with an exemplary embodiment of the present invention.

Referring now to FIG. 1, a schematic diagram of a RRAM communication system 100 including a master controller 102 and N RRAM controllers (or RRAM hardmacs) 104 (N>0) in accordance with an exemplary embodiment of the present invention is shown. Each RRAM controller 104 may execute several different types of tests. The master controller 102 is the main control unit, which loads test input parameters into the RRAM controllers 104, starts execution of tests and obtains results of test execution from the RRAM controllers 104.

The master controller 102 is connected to every RRAM controller 104 via an 8-bit bus RRAM_COM. Each command from the master controller 102 translates to all RRAM controllers 104 simultaneously using this bus. Each RRAM hardmac 104 has its own unique index i, 0<=i<N. 1-bit input RRAM_STATUS_SCAN_IN of each RRAM hardmac 104 with index i>0 is connected to 1-bit output RRAM_STATUS_SCAN_OUT of the "previous" RRAM hardmac 104 with index (i-1). Input RRAM_STATUS_SCAN_IN of the "first" RRAM hardmac with index 0 is connected to output RRAM_STATUS_SCAN_OUT of the master controller 102. Output RRAM_STATUS_SCAN_OUT of the "last" RRAM hardmac with index (N-1) is connected to input RRAM_STATUS_SCAN_IN of the master controller 102. Thus, all RRAM hardmacs 104 and the master controller 102 are connected in a chain. The master controller 102 may obtain results of test execution from the RRAM hardmac 104 through this chain.

Figure 2:
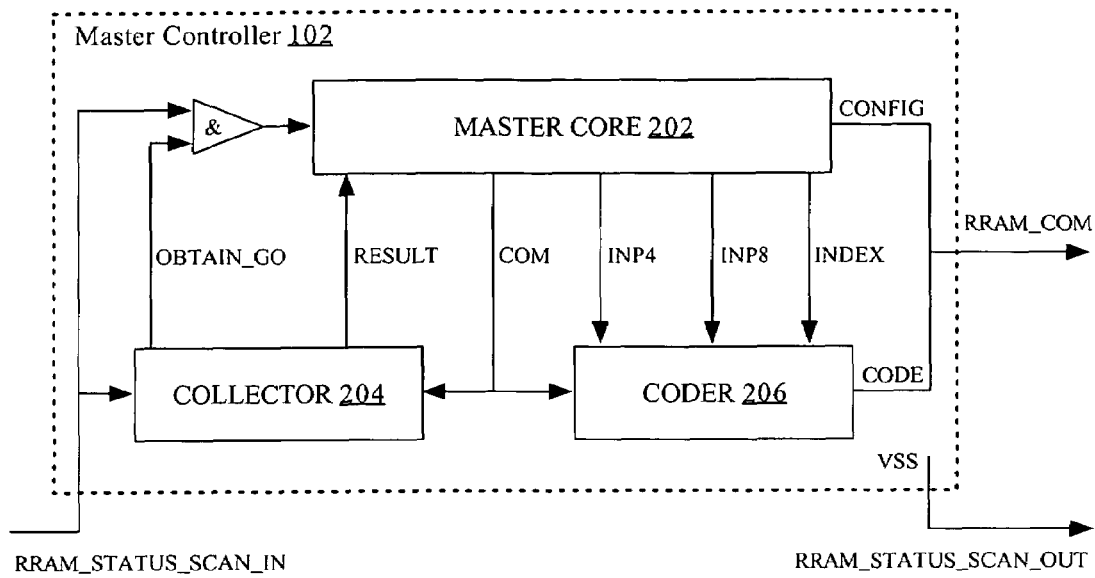
FIG. 2 is a schematic diagram of an exemplary embodiment of the master controller shown in FIG. 1 in accordance with the present invention.

FIG. 2 is a schematic diagram of an exemplary embodiment of the master controller 102 shown in FIG. 1 in accordance with the present invention. The master controller 102 includes 3 main submodules: a master core submodule (or Master CORE) 202, a collector submodule (or COLLECTOR) 204 and a coder submodule (or CODER) 206. The master core 202 is the main control block of the master controller 102 and produces commands for setting test parameters into the RRAM controller 104 (see FIG. 1), for starting tests and for obtaining results from the RRAM controller 104. The collector 204 and the coder 206 realize communication between the master core 202 and the RRAM controller 104. Control commands from the master core 202 are translated to the collector 204 and the coder 206 using bus COM[7:0] (see FIG. 2). The coder 206 transforms data and translates it to the RRAM controller 104. The collector 204 receives data from the RRAM controller 104, decodes it and delivers it to the master core 202.

Figure 3:
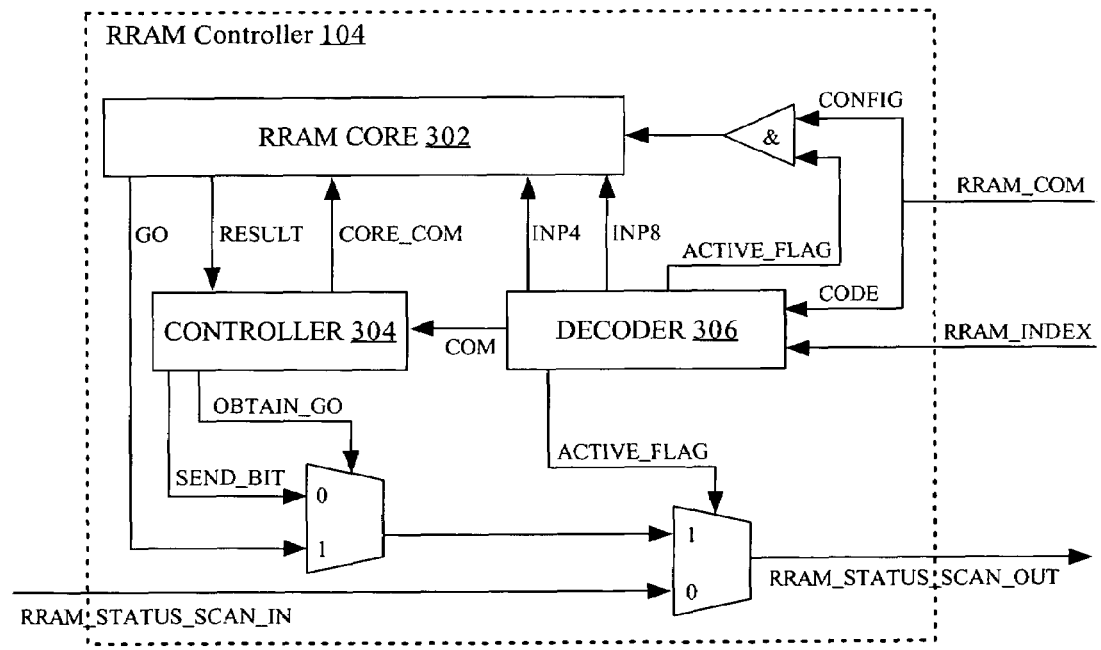
FIG. 3 is a schematic diagram of an exemplary embodiment of the RRAM controller shown in FIG. 1 in accordance with the present invention.

FIG. 3 is a schematic diagram of an exemplary embodiment of the RRAM controller 104 shown in FIG. 1 in accordance with the present invention. The RRAM controller 104 includes 3 main submodules: a RRAM core submodule (or RRAM CORE) 302, a controller submodule (or CONTROLLER) 304 and a decoder submodule (or DECODER) 306. The RRAM core 302 executes different tests depending on the commands received from the master controller 102 (see FIG. 1). The controller 304 and the decoder 306 are needed for communication purposes. The decoder 306 decodes information received from the coder 206 of the master controller (see FIG. 2), restores commands of the master controller 102, renews test parameters and sets the value of ActiveFlag. The ActiveFlag is a 1-bit register which determines the active state of the RRAM controller 104. If the value of this register is 1, then the corresponding RRAM controller 104 is active and can perform commands from the master controller 102. Otherwise, the RRAM controller 104 is not active and does not react to any command of the master controller 102 other than the command that changes the value of ActiveFlag. Only one RRAM controller 104 may be active in a given time. On the other hand, any number of RRAM controllers 104 can simultaneously execute tests. Therefore, the present RRAM communication system 100 supports sequential loading of test data and simultaneous execution of tests. ActiveFlag may also support transmitting data through a scan chain. If the value of ActiveFlag is 0, then the value of SCAN_IN input is directly translated to SCAN_OUT. Otherwise, SCAN_OUT is connected to SEND_BIT output of the controller 304. Such organization of communication allows translating an output value of the controller 304 from the active RRAM controller 104 to the master controller 102.

The controller 304 retrieves test results from the RRAM core 302 and sends them to the master controller 102 using SEND_BIT output.

There are two methods of transferring data from the master controller 102 to the RRAM controller 104. First, bus CODE may be used, which utilizes 4 high bits of bus RRAM_COM and connects the coder 206 and the decoder 306. Alternatively, bus CONFIG may be used, which utilizes 4 low bits of bus RRAM_COM and transfers data directly from the master core 202 to the RRAM core 302.

B. Communication Protocol Overview

FIG. 4 is a flow diagram of a method 400 for implementing test execution in the RRAM communication system shown in FIG. 1 in accordance with an exemplary embodiment of the present invention. First, a RRAM controller of the RRAM communication system is set to an active state 402. For this purpose, a master core (e.g., the master core 202 shown in FIG. 2) sets a correct value of INDEX bus (see, e.g., FIG. 2) and generates SET_ACTIVE_RRAM command. A decoder (e.g., the decoder 306 shown in FIG. 3) of the RRAM controller sets its ACTIVE_FLAG to 1.

Then, the master controller of the RRAM communication system sets values of test variables, and these values of test variables are transferred from the master controller to the active RRAM controller 404. Each variable is available in a coder submodule (e.g., the coder 206 shown in FIG. 2) via the appropriate input. There are two arrays of test variables: INP4 and INP8. Each variable of the INP4 array has a length of 4 bits or fewer. Each variable of the INP8 array has a length of between 5 and 8 bits. A separate setting command exists for each test variable. After execution of SET_INP4_<i> command, the value of i-th element of the INP4 array in the master controller translates to i-th element of the INP4 array in the active RRAM controller. The method of execution of SET_INP8_<i> command is the same.

After that, the master controller generates a command for starting test 406. The RRAM controller may execute several different tests. A separate command of the master controller is reserved for each test. These commands are performed by a RRAM core submodule (e.g., the RRAM core 302 shown in FIG. 3) and are therefore called CORE_RRAM_COM_<i>.

During the test execution, the master controller sets direct connection with the active RRAM Controller 408. This direct connection enables one to obtain a new bit from GO pin of the active RRAM controller on every clock cycle. To close this connection, the master controller invokes END_GO command at the end of the test execution.

After the test completion, the master controller retrieves the test results 410. These results are collected in output array RESULT of RRAM controller. A separate command GET_RESULT_<i> exists for retrieving a value of each separate flag. After execution of this command, the value of the i-th element of RESULT array in the active RRAM controller is translated to the i-th element of RESULT output of a collector submodule of the master controller. FIG. 5 is a description of master controller commands in accordance with an exemplary embodiment of the present invention.

C. Description of CODER and DECODER Submodules

Figure 6:
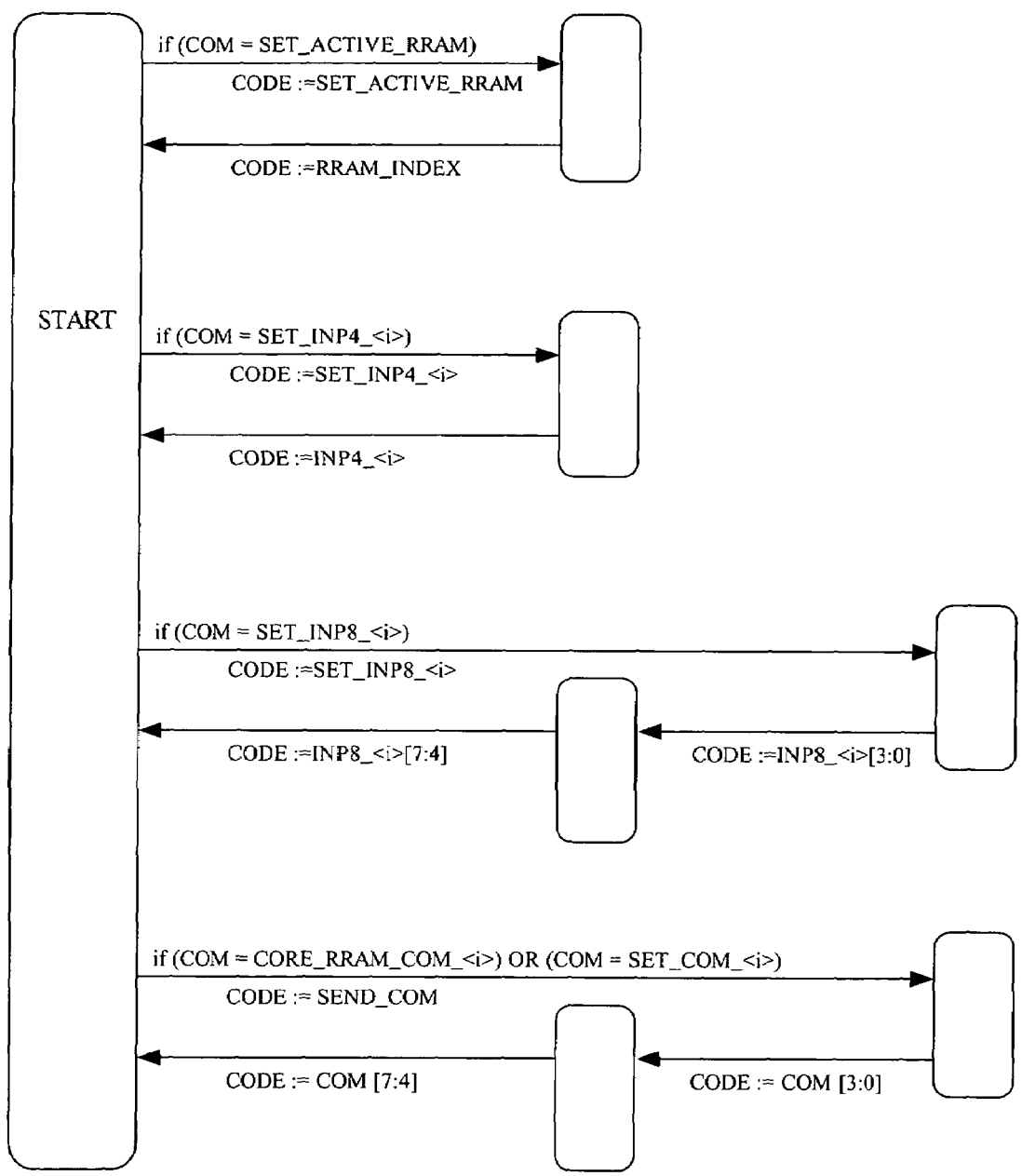
FIG. 6 illustrates a CODER state diagram in accordance with an exemplary embodiment of the present invention.
Figure 7:
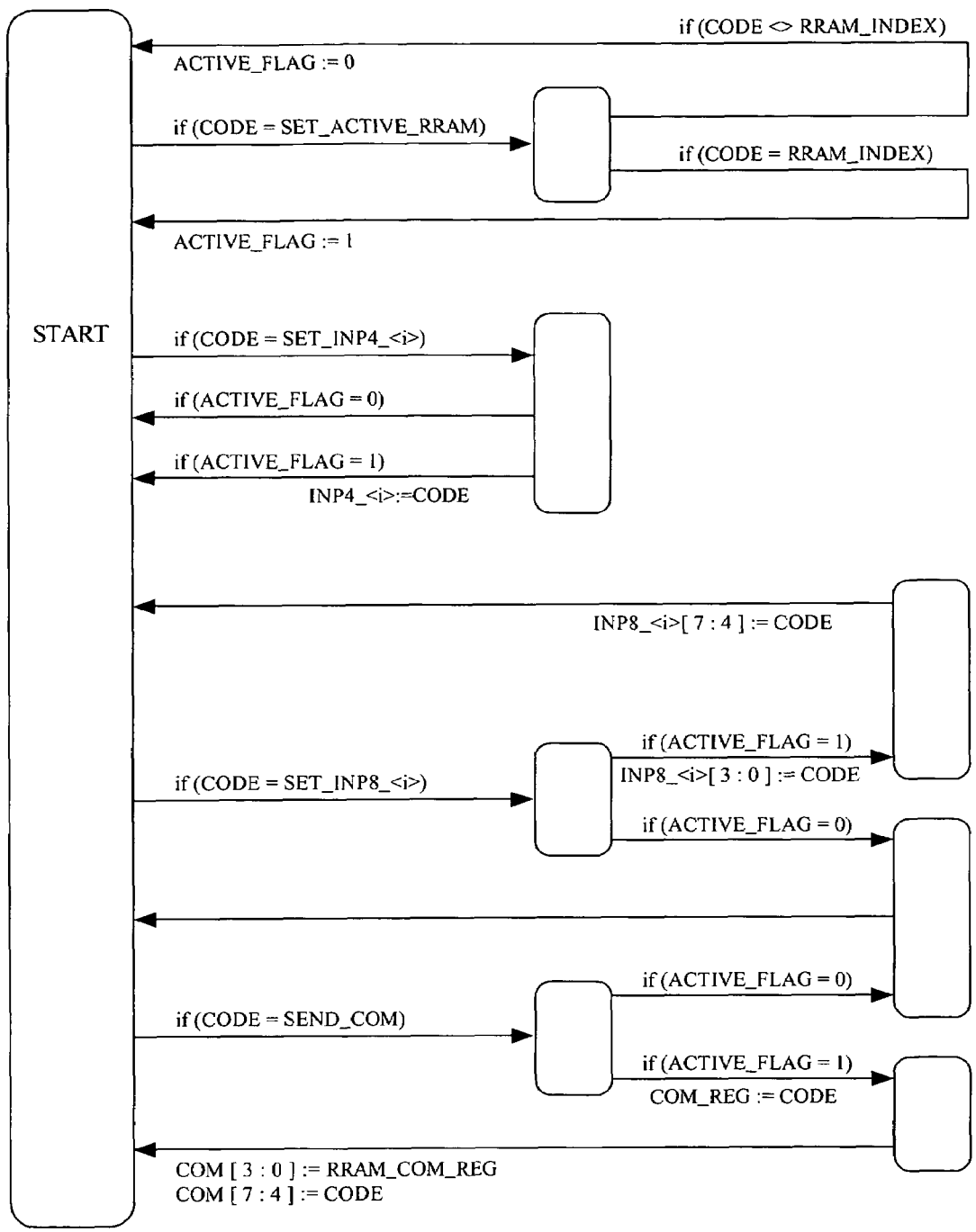
FIG. 7 illustrates a DECODER state diagram in accordance with an exemplary embodiment of the present invention.

FIG. 6 illustrates a CODER state diagram in accordance with an exemplary embodiment of the present invention, and FIG. 7 illustrates a DECODER state diagram in accordance with an exemplary embodiment of the present invention.

The CODER may be the coder submodule 206 shown in FIG. 2, and the DECODER may be the decoder submodule 306 shown in FIG. 3.

For transmitting RRAM commands and data, submodules CODER and DECODER use a low level protocol. Using this protocol requires 2 or 3 clock cycles for transmitting each RRAM command. Duration of transmitting depends on the type of the command.

When CODER receives SET_ACTIVE_RRAM command from Master CORE, it performs that command during two clock cycles. First it produces a special code value CODER_SET_ACTIVE_RRAM. During the next clock cycle, CODER transmits the current value of RRAM_INDEX.

When DECODER receives CODER_SET_ACTIVE_RRAM code, it compares the next CODE value with RRAM_INDEX value. If these values are equal, then DECODER sets ACTIVE_FLAG to 1. Otherwise, it sets ACTIVE_FLAG to 0.

When CODER receives SET_INP4_<i> from Master CORE, it produces a special code value CODER_SET_INP4_<i>. This value is unique for every SET_INP4_<i> RRAM command. During the next clock cycle, CODER sends the current value of INP4_<i>.

When CODER receives SET_INP8_<i> from Master CORE, it produces a special code value CODER_SET_INP8_<i>. This value is unique for every SET_INP8_<i> RRAM command. During the next clock cycle, CODER sends 4 low bits of INP8_<i>. During the third clock, CODER sends high bits of INP8_<i>.

After receiving any other command from Master CORE, CODER sends a special code value CODER_SEND_COM. Then during two clock cycles, it sends code of that RRAM command: first it sends 4 low bits of the command code; then it sends high bits of the command code. Therefore, CODER uses three clocks to translate this command (see FIG. 6).

There are 16 possible code values, three of which are specified: CODER_NO_COM (absence of any command), CODER_SET_ACTIVE_RRAM, and CODER_SEND_COM. Therefore, the present RRAM communication system can support up to 13 different input variables.

For each of these commands, DECODER performs reverse transformation (see FIG. 7).

D. Description of CONTROLLER and COLLECTOR Submodules

Figure 8:
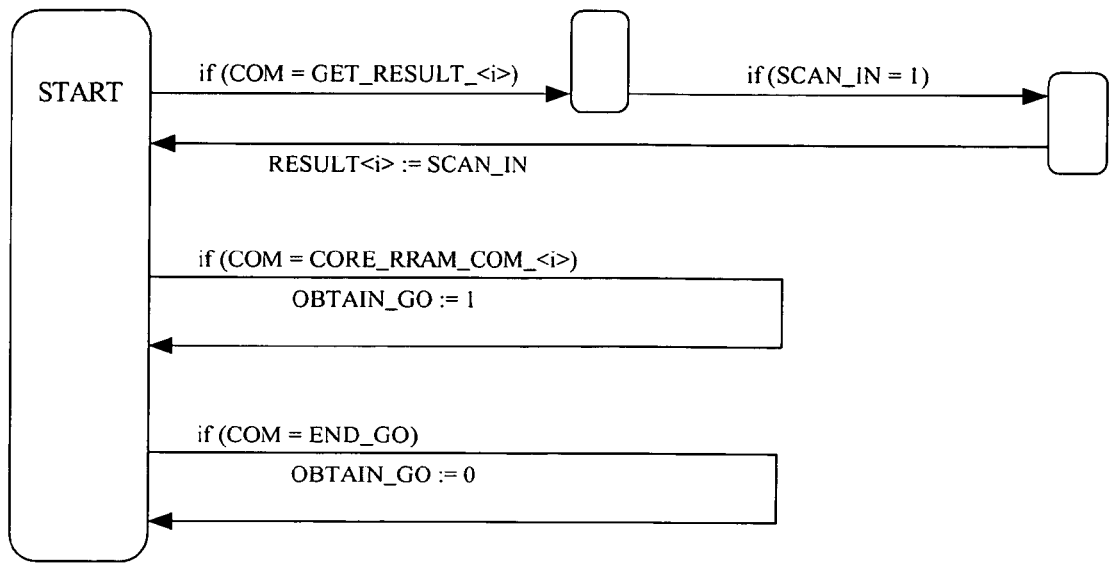
FIG. 8 illustrates a COLLECTOR state diagram in accordance with an exemplary embodiment of the present invention.
Figure 9:
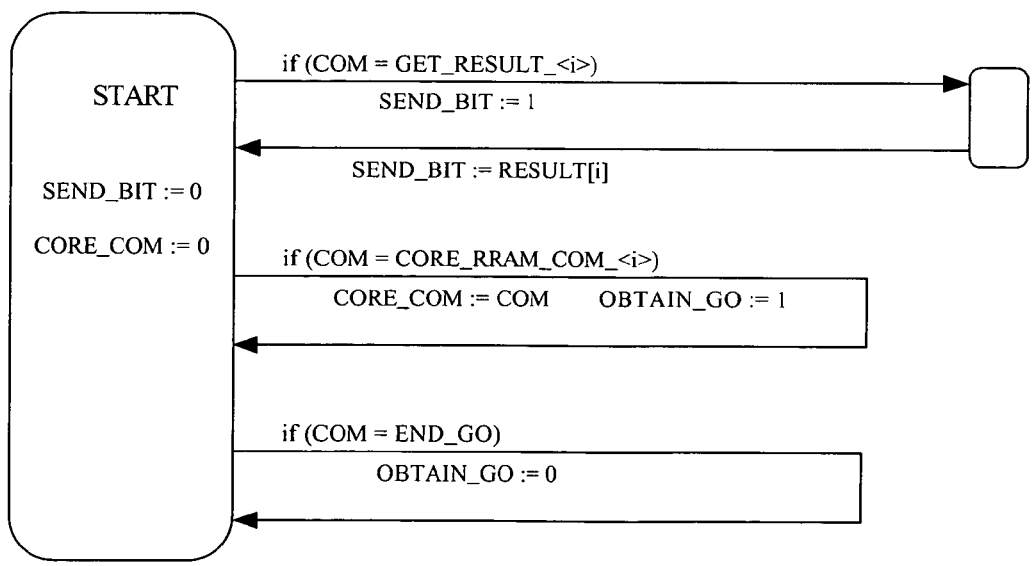
FIG. 9 illustrates a CONTROLLER state diagram in accordance with an exemplary embodiment of the present invention.

FIG. 8 illustrates a COLLECTOR state diagram in accordance with an exemplary embodiment of the present invention, and FIG. 9 illustrates a CONTROLLER state diagram in accordance with an exemplary embodiment of the present invention. The COLLECTOR may be the collector submodule 204 shown in FIG. 2, and the CONTROLLER may be the controller submodule 304 shown in FIG. 3.

When CONTROLLER receives GET_RESULT_<i> command from DECODER, it performs this command in two steps. At first it sends 1 to SCAN_OUT wire. Then it sends the current value of RESULT_<i> to this wire.

When COLLECTOR receives GET_RESULT_<i> command from Master CORE, it memorizes this command in some inner register. After receiving 1 from SCAN_IN wire, it checks this register and sets an appropriate value of RESULT array.

When CONTROLLER receives CORE_RRAM_COM_<i> command from DECODER, it sets OBTAIN_GO output to 1. When COLLECTOR receives CORE_RRAM_COM_<i> command from Master CORE, it also sets its output OBTAIN_GO to 1. As a result, the direct connection between GO output of RRAM Controller and GO input of MASTER Controller is created.

When CONTROLLER or COLLECTOR receives END_GO command, CONTROLLER or COLLECTOR sets OBTAIN_GO to 0.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form hereinbefore described being merely an explanatory embodiment thereof, it is the intention of the following claims to encompass and include such changes.

What is claimed is:

1. A method for implementing test execution in a RRAM communication system including a master controller and at least one RRAM controller, said master controller including a master core submodule, a collector submodule, and a coder submodule, each of said at least one RRAM controller including a RRAM core submodule, a controller submodule, and a decoder submodule, said method comprising steps of:
   setting one of at least one RRAM controller active;
   setting values of test variables by said master controller and transferring said values of test variables from said master controller to said active RRAM controller;
   generating, by said master controller, a command for starting test;
   setting, by said master controller, a direct connection with said active RRAM controller during test execution; and
   retrieving, by said master controller, a test result after test completion using a command GET_RESULT_<i>.

2. The method of claim 1, wherein said step of setting one of at least one RRAM controller active comprises:
   setting, by said master core submodule, a correct value of an INDEX bus, said INDEX bus connecting said master core submodule and said coder submodule;
   generating, by said master core submodule a SET_ACTIVE_RRAM command; and
   setting ACTIVE_FLAG of a decoder of said one of at least one RRAM controller to 1 by said decoder of said one of at least one RRAM controller.

3. The method of claim 1, wherein said test variables are in either an INP4 array or an INP4 array, each test variable in said INP4 array having a length of 4 bits or fewer, each test variable in said INP8 array having a length of between 5 and 8 bits.

4. The method of claim 3, wherein after execution of an SET_INP4_<i> command, a value of i-th element of said INP4 array in said master controller translates to i-th element of said INP4 array in said active RRAM controller.

5. The method of claim 3, wherein after execution of an SET_INP8_<i> command, a value of i-th element of said INP8 array in said master controller translates to i-th element of said INP8 array in said active RRAM controller.

6. The method of claim 1, wherein said command for starting test is performed by said RRAM core submodule.

7. The method of claim 1, further comprises closing said direct connection by invoking an END_GO command by said master controller at an end of a test execution.

8. The method of claim 1, wherein said test result is collected in an output array RESULT of said active RRAM controller.

9. The method of claim 8, wherein after execution of said command GET_RESULT_<i>, a value of i-th element of said RESULT array in said active RRAM controller is translated to i-th element of RESULT output of said collector submodule of said master controller.

10. A system for implementing test execution in a RRAM communication system including a master controller and at least one RRAM controller, said master controller including a master core submodule, a collector submodule, and a coder submodule, each of said at least one RRAM controller including a RRAM core submodule, a controller submodule, and a decoder submodule, said system comprising:
    means for setting one of at least one RRAM controller active;
    means for setting values of test variables and means for transferring said values of test variables from said master controller to said active RRAM controller;
    means for generating a command for starting test;
    means for setting a direct connection with said active RRAM controller during test execution; and
    means for retrieving a test result after test completion using a command GET_RESULT_<i>.

11. The system of claim 10, wherein said means for setting one of at least one RRAM controller active comprises:
    means for setting a correct value of an INDEX bus, said INDEX bus connecting said master core submodule and said coder submodule;
    means for generating a SET_ACTIVE_RRAM command; and
    means for setting ACTIVE_FLAG of a decoder of said one of at least one RRAM controller to 1.

12. The system of claim 10, wherein said test variables are in either an INP4 array or an INP4 array, each test variable in said INP4 array having a length of 4 bits or fewer, each test variable in said INP8 array having a length of between 5 and 8 bits.

13. The system of claim 12, wherein after execution of an SET_INP4_<i> command, a value of i-th element of said INP4 array in said master controller translates to i-th element of said INP4 array in said active RRAM controller.

14. The system of claim 12, wherein after execution of an SET_INP8_<i> command, a value of i-th element of said INP8 array in said master controller translates to i-th element of said INP8 array in said active RRAM controller.

15. The system of claim 10, wherein said command for starting test is performed by said RRAM core submodule.

16. The system of claim 10, further comprises means for closing said direct connection by invoking an END_GO command at an end of a test execution.

17. The system of claim 10, wherein said test result is collected in an output array RESULT of said active RRAM controller.

18. The system of claim 17, wherein after execution of said command GET_RESULT_<i>, a value of i-th element of said RESULT array in said active RRAM controller is translated to i-th element of RESULT output of said collector submodule of said master controller.

19. A RRAM communication system, comprising:
at least one RRAM controller; and
a master controller, communicatively coupled to each of said at least one RRAM controller, for loading test input parameters into said at least one RRAM controller, starting execution of a test and obtaining a result of test execution from said at least one RRAM controller,
wherein said each of said at least one RRAM controller is suitable for executing different tests depending on commands received from said master controller, said RRAM communication system supporting sequential loading of test data and simultaneous execution of tests.

20. The RRAM communication system of claim 19, wherein said master controller comprises:
a master core submodule for producing commands for setting said test input parameters into said at least one RRAM controller, for starting tests and for obtaining test results from said at least one RRAM controller; and
a collector submodule and a coder submodule, communicatively coupled to each other and to said master core submodule, for realizing communication between said master core and said at least one RRAM controller.

21. The RRAM communication system of claim 20, wherein said coder submodule transforms and translates data to said at least one RRAM controller.

22. The RRAM communication system of claim 20, wherein said collector submodule receives data from said at least one RRAM controller, decodes said data and delivers said data to said master core submodule.

23. The RRAM communication system of claim 20, wherein said each of said at least one RRAM controller comprises:

a RRAM core submodule for executing different tests depending on commands received from said master controller; and
a controller submodule and a decoder submodule, communicatively coupled to each other and to said RRAM core submodule,
wherein said decoder submodule decodes information received from said coder submodule of said master controller, restores commands of said master controller, renews test parameters and sets a value of ActiveFlag of one of said at least one RRAM controller, said ActiveFlag being a 1-bit register which determines an active state of said one of said at least one RRAM controller.

24. The RRAM communication system of claim 23, wherein when said value of said ActiveFlag is 1, said one of said at least one RRAM controller is active and performs a command received from said master controller.

25. The RRAM communication system of claim 23, wherein when said value of said ActiveFlag is not 1, said one of said at least one RRAM controller is not active and does not react to any command of said master controller other than a command that changes said value of said ActiveFlag.

26. The RRAM communication system of claim 23, wherein said ActiveFlag supports transmitting data through a scan chain.

* * * * *